United States Patent [19]

Ishigami

[11] Patent Number: 5,057,906
[45] Date of Patent: Oct. 15, 1991

[54] PLASTIC MOLDED TYPE SEMICONDUCTOR DEVICE

[75] Inventor: Toshio Ishigami, Kawasaki, Japan

[73] Assignee: Kabushiki Kaisha Toshiba, Kawasaki, Japan

[21] Appl. No.: 524,883

[22] Filed: May 18, 1990

[30] Foreign Application Priority Data

May 22, 1989 [JP] Japan .................................. 1-128313

[51] Int. Cl.⁵ ....................... H01L 23/36; H01L 23/50
[52] U.S. Cl. .......................................... 357/80; 357/81; 357/75
[58] Field of Search ......................... 357/74, 75, 80, 81

[56] References Cited

U.S. PATENT DOCUMENTS

| | | | |
|---|---|---|---|
| 3,639,770 | 2/1972 | Zizelmann | 357/75 |
| 3,820,153 | 6/1974 | Quinn | 357/75 |
| 4,032,964 | 6/1977 | Boeters | 357/75 |
| 4,518,982 | 5/1985 | DuBois et al. | 357/75 |

FOREIGN PATENT DOCUMENTS 0330372 8/1989 European Pat. Off. .
2618944 2/1989 France .

OTHER PUBLICATIONS

"Hybrid Integrated Circuit", Takenori Yamashita, Patent Abstract, No. 60-160154, vol. 9, No. 328, published Dec. 24, 1985.

Primary Examiner—William D. Larkins
Assistant Examiner—Teresa Davenport
Attorney, Agent, or Firm—Finnegan, Henderson, Farabow, Garrett, and Dunner

[57] ABSTRACT

A first high-power element chip having high current consumption is mounted and fixed of a first bed portion on a heat radiating fin by soldering. A second high-power element chip is mounted and fixed by high-temperature die bonding on a second bed portion formed by denting a part of one end of a lead frame made of a metal thin plate, and an insulating paste is filled between the lower surface of the second bed portion and the upper surface of the first bed portion. In addition, a logic element chip is mounted and fixed on one end of another lead frame made of a metal thin plate by a conductive adhesive such as a silver paste.

4 Claims, 1 Drawing Sheet

PLASTIC MOLDED TYPE SEMICONDUCTOR DEVICE

BACKGROUND OF THE INVENTION

1. Field of the Invention

The present invention relates to a plastic molded type semiconductor device, and more particularly, to a multichip plastic molded type semiconductor device.

2. Description of the Related Art

A multichip plastic molded type semiconductor device in which a plurality of semiconductor chips are sealed in a package is conventionally known.

In conventional multichip plastic molded type semiconductor devices, there is a semiconductor device in which a plurality of logic element chips, each having low current consumption, are sealed, and a semiconductor device in which a plurality of high-power element chips, each having high current consumption, are sealed. However, in the conventional semiconductor device, semiconductor chips of different types such as a logic element chip and a high-power element chip, cannot be sealed in the same package.

In a conventional multichip semiconductor device, semiconductor devices to be sealed are classified by current consumption, and chips of the same type are sealed in one package due to the following reason.

A high-power element chip having high current consumption must have a heat radiating fin for radiating heat generated from the chip. The fin is used as a common mounting region, bed portion, for semiconductor chips. For this reason, in order to have uniform chip potentials of a plurality of chips, chips of the same type must be mounted. If a logic element chip having low current consumption is mounted on the heat radiating fin serving as the bed portion, the logic element chip is influenced by heat generated from a high-power element chip which causes degradation of electric characteristics of the logic element chip or a change in its characteristics.

In addition, the heat radiating fin, serving as the bed portion, is normally made of a conductive material such as a metal. Therefore, when a plurality of semiconductor chips are mounted on the heat radiating fin, these chips are difficult to electrically isolate from each other. As a countermeasure to this, the semiconductor chips may be fixed on the heat radiating fin using an insulating substrate or an insulating paste. For example, in a multichip plastic molded type semiconductor device constituted by only a plurality of high-power element chips, the former method, i.e., the method using an insulating substrate, can be employed in a multichip plastic molded type semiconductor device constituted by only a plurality of high-power element chips. However, since the insulating substrate is used, production cost is increased. Thus, this method does not provide low-price products. On the other hand, in the latter method, since the insulating paste is used, an electrode cannot be extracted from the lower surface of the semiconductor chip.

Since the high-power element chip generates a large amount of heat and an electrode must be extracted from the lower surface of the semiconductor chip, a fixing method by soldering or a eutectic die bonding method, which has excellent ohmic characteristics and thermal conductive characteristics, is used as a means for fixing a semiconductor chip on a bed portion. Contrasted to this, in a logic element chip which generates a small amount of heat, in order to obtain an inexpensive product, bonding using a conductive adhesive is used. For this reason, if a multichip plastic molded type semiconductor device, in which a high-power element chip and a logic element chip are hybridized, is formed, the assembling process is complicated due to different die bonding methods for different types of chip, thereby increasing production cost. In addition, conductive adhesive has poor thermal resistance which causes degradation of the adhesive and a change in the properties of the adhesive.

Even if one die bonding method is used, characteristics of the chips are degraded, and the production cost is increased.

As described above, conventionally, a multichip plastic molded type semiconductor device, in which a plurality of semiconductor chips of different types such as a high-power element chip and a logic element chip are sealed in a single package, is difficult to realize.

In addition, in a multichip plastic molded type semiconductor device, in which only a plurality of high-power element chips are sealed, an insulating substrate must be used, and the product is expensive. High-power element chips of different types are difficult to be mounted in a single package.

SUMMARY OF THE INVENTION

The present invention has been made in consideration of the above points, and has as its object to provide a low-cost, low production cost, multichip plastic molded type semiconductor device in which a plurality of high-power element chips of different types or a combination of a plurality of high-power element chips and at least one logic element chip can be mounted in a single package.

According to the present invention, there is provided a plastic molded type semiconductor device comprising a first semiconductor chip mounting region having a first conductivity, a first semiconductor chip mounted in the first semiconductor chip mounting region through a conductive adhesive, a plurality of lead frames each having one end positioned in the first semiconductor chip mounting region, a second semiconductor chip mounting region formed by bending a part of one of the plurality of lead frames toward the first semiconductor chip mounting region, a second semiconductor chip mounted in the second semiconductor chip mounting region through a conductive adhesive, and an insulating member which is provided between a lower surface of the second semiconductor chip mounting region and an upper surface of the first semiconductor chip mounting region to thermally bond these regions.

DETAILED DESCRPTION OF THE PREFERRED EMBODIMENT

A plastic molded type semiconductor device according to an embodiment of the present invention will be described below with reference to the accompanying drawings.

Figure 1:
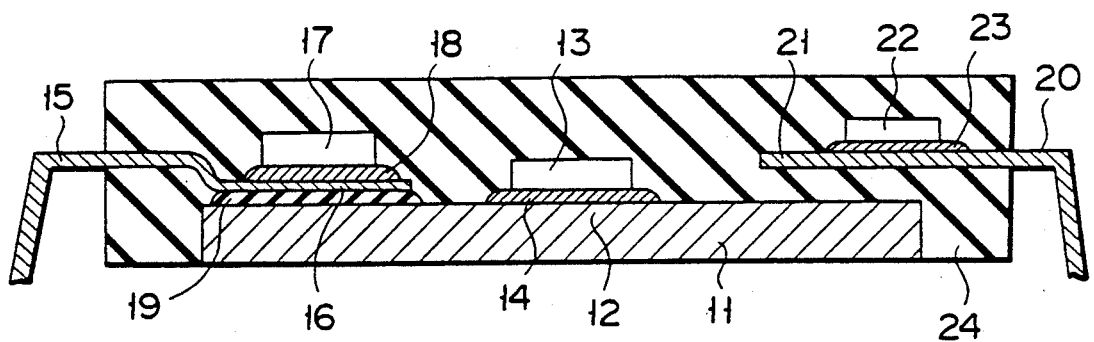
FIG. 1 is a sectional view showing an element structure of a plastic molded type semiconductor device according to an embodiment of the present invention.

As shown in FIG. 1, a first high-power element chip 13 having high current consumption is mounted and fixed on a first bed portion 12 of a heat radiating fin 11 for mounting a semiconductor chip by, e.g., soldering. A solder material used for soldering the first high-power element chip 13 is represented by reference numeral 14 in FIG. 1.

A part of one end of a lead frame 15 formed by, e.g., punching out a thin metal plate is bent, and a second high-power element chip 17 is mounted and fixed on a second bed portion 16 bent to come close to the heat radiating fin 11 by, e.g., high-temperature die bonding. For example, an Au-Si eutectic material used for the high-temperature die bonding is represented by reference numeral 18 in FIG. 1. For example, an insulating paste 19 is filled between the lower surface of the second bed portion 16 and the upper surface of the first bed portion 12 of the heat radiating fin 11. For this reason, the second bed portion 16 and the first bed portion 12 are thermally bonded by the insulating paste 19 but are electrically insulated from each other.

In addition, a third bed portion 21 is set in a predetermined region on one end of another lead frame 20 which is different from the above lead frame 15 and is made of a thin metal plate. On the third bed portion 21, a logic element chip 22 having low current consumption is mounted and fixed by a conductive adhesive 23, such as a silver paste. Note that although only two lead frames are shown in FIG. 1, a required number of other lead frames (not shown) adjacent to the lead frames 15 and 20 are arranged.

Wires (not shown) are connected to upper electrodes (not shown) of the semiconductor chips 13, 17, and 22. The chips are electrically connected to each other by these wires, and other lead frames different from the lead frames 15 and 20 are electrically connected to the chips by these wires. The resultant structure is entirely sealed by an insulating synthetic resin material (insulating plastic) to form a package 24.

Figure 2:
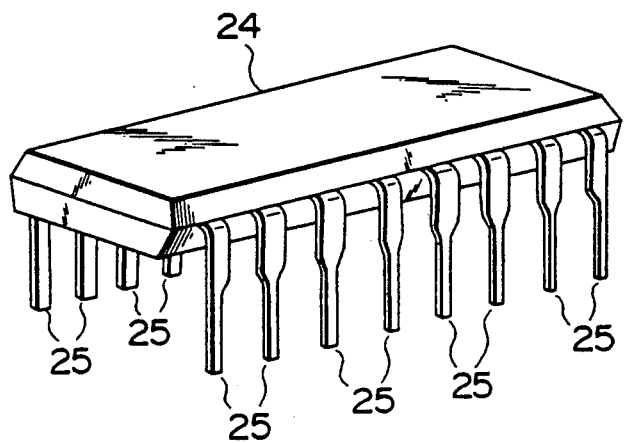
FIG. 2 is a perspective view showing the outer appearance of the plastic molded type semiconductor device of the above embodiment.

A plurality of lead frames 25 such as the lead frames 15 and 20 are led out from two side surfaces of the package 24 to oppose each other, as shown in FIG. 2. The semiconductor device according to this embodiment is a DIP (Dual In Line) type semiconductor device.

In the plastic molded type semiconductor device with the above structure, the first high-power element chip 13 mounted on the first bed portion 12 of the heat radiating fin 11 and the second high-power element chip 17 mounted on the second bed portion 16 formed by denting the lead frame 15 can be electrically insulated from each other without using an insulating substrate. Heat radiating paths of the high-power element chips 13 and 17 are described as follows. Heat generated from the first high-power element 13 is radiated through the heat radiating fin 11, and heat generated from the second high-power element chip 17 is radiated through the heat radiating fin 11 and the lead frame 15. In this case, when the insulating paste 19 has excellent heat resistance and heat conductive characteristics, the present invention is further effective.

In addition, since the high-power element chips 13 and 17 mounted on the bed portions 12 and 16, are electrically insulated from each other, different types of chips can be used as both the high-power element chips 13 and 17. Since the high-power element chips 13 and 17 are fixed by soldering or high-temperature die bonding using a eutectic material, electrodes and the like can be extracted from the lower surfaces of the high-power element chips 13 and 17. Thus, a multichip plastic molded type semiconductor device, in which high-power element chips of plural types are sealed, can be provided at a low production cost.

In the above embodiment, the logic element chip 22 having low current consumption is sealed in addition to the high-power element chips 13 and 17. The logic element chip 22 can be sealed with the high-power element chips 13 and 17 by using the third bed portion 21 set on the lead frame 20. Conventionally, since adhesive properties of a conductive adhesive, serving as a means for fixing a logic element chip, are degraded due to the temperature and characteristics of the logic element chip being changed and degraded, the logic element chip is difficult to mount with a high-power element chip in a single package. As described above, according to the present invention, since the lead frame 20 is used as a bed portion, the logic element chip 22 is thermally and electrically insulated from the first and second bed portions 12 and 16 for mounting the high-power element chips 13 and 17. Thus, since the first and second bed portions for mounting the high-power element chips are thermally and electrically insulated from the third bed portion 21 for mounting the logic element chip, both the logic element chip having low current consumption and the high-power element chips can be mounted in a single package 24.

When high-power element chips of different types and a logic element chip are mounted in a single package 24, semiconductor devices ranging from a plastic molded type semiconductor device having a function of driving an electric driving part such as an electric motor to a high-performance plastic molded type semiconductor device such as a CPU having an arithmetic function can be provided. According to the present invention, even such a high-performance plastic molded type semiconductor device can be provided at a low production cost, i.e., a low price.

Note that, in the above embodiment, the present invention is employed in a DIP plastic molded type semiconductor device, but it is not limited to a DIP type device. For example, the present invention may be employed in an SIL (Single In Line) type semiconductor device. In addition, the present invention can be employed in semiconductor devices in which lead frames are extracted from three side surfaces of a package, and in which lead frames are extracted from four side surfaces of a package, i.e., a QFP (Quad Flat Package) type. The the present invention can also be applied to other types of semiconductor devices than the above-described types.

As described above, according to the present invention, there is provided a low-cost (low production cost) multichip plastic molded type semiconductor device wherein a plurality of different types of high-power element chips or a combination of a plurality of high-power element chips and at least one logic element chip can be mounted in a single package.

What is claimed is:

1. A plastic molded type semiconductor device comprising:
   a first semiconductor chip mounting region formed on a radiation fin;

a first semiconductor chip mounted on said first semiconductor chip mounting region by an adhesive member;

a first lead frame with an end portion located on said radiation fin;

a second semiconductor chip mounting region formed of a part of said first lead frame, said part being bent toward the first semiconductor chip mounting region;

a second semiconductor chip mounted on said second semiconductor chip mounting region via a first conductive adhesive member;

an insulating member provided between and thermally bonded to a lower surface of said second semiconductor chip mounting region and an upper surface of said first semiconductor chip mounting region;

a second lead frame distinct from said radiation fin;

a third semiconductor chip mounted on said second lead frame via a second conductive adhesive member; and a plastic molded member for housing said first, second, and third semiconductor chips therein.

2. A plastic molded type semiconductor device according to claim 1, wherein said first semiconductor chip and said second semiconductor chip are high-power element chips, each generating a relatively large amount of heat.

3. A plastic molded type semiconductor device according to claim 1, wherein said first semiconductor chip and said second semiconductor chip are high-power element chips to which chip potentials are independently supplied.

4. A plastic molded type semiconductor device according to claim 1, wherein said third semiconductor chip is a logic element chip generating a relatively small amount of heat.

* * * * *